United States Patent [19]

Kusaka et al.

[11] Patent Number: 5,288,656

[45] Date of Patent: Feb. 22, 1994

[54] METHOD OF MANUFACTURING A CCD SOLID STATE IMAGE SENSING DEVICE

[75] Inventors: Takahisa Kusaka, Tokyo; Hideo Kanbe, Kanagawa; Akio Izumi, Kanagawa; Hideshi Abe, Kanagawa; Masanori Ohashi, Kanagawa; Atsushi Asai, Kanagawa, all of Japan

[73] Assignee: Sony Corporation, Tokyo, Japan

[21] Appl. No.: 949,130

[22] Filed: Sep. 23, 1992

Related U.S. Application Data

[62] Division of Ser. No. 851,336, Mar. 16, 1992, abandoned.

[30] Foreign Application Priority Data

Mar. 15, 1991 [JP] Japan .................................. 3-051464

[51] Int. Cl.$^5$ .............................................. H01L 21/70
[52] U.S. Cl. ...................................... 437/53; 437/28; 437/50
[58] Field of Search .................. 437/53, 28, 29, 30, 437/3, 50; 257/222, 223, 215

[56] References Cited

U.S. PATENT DOCUMENTS

| | | | |
|---|---|---|---|
| 4,947,224 | 8/1990 | Kuroda et al. | 357/30 |
| 4,992,392 | 2/1991 | Nichols et al. | 437/27 |
| 5,084,749 | 1/1992 | Losee | 257/222 |
| 5,181,093 | 1/1993 | Kawaura | 257/223 |

Primary Examiner—Brian E. Hearn
Assistant Examiner—Tuan Nguyen
Attorney, Agent, or Firm—Hill, Steadman & Simpson A Professional Corporation

[57] ABSTRACT

In a CCD solid state image sensing device in which a photo-sensitive section is constructed by a photodiode formed by a PN junction between a first P-type well region and an N-type impurity diffusion region formed on an N-type silicon substrate, the N-type impurity diffusion region is formed by the ion implantation of single substance of arsenic (As). According to this CCD solid state image sensing device, a bright flaw on an image sensing screen, which is one of the defects encountered with an image sensing screen, can be reduced. Also, the n-type impurity diffusion region constructing the PN junction can be reduced in size and the CCD solid state image sensing device itself can be made compact in size. Further, a method of manufacturing a CCD solid state image sensing device also is provided.

2 Claims, 3 Drawing Sheets

METHOD OF MANUFACTURING A CCD SOLID STATE IMAGE SENSING DEVICE

This is a division, of application Ser. No. 07/851,336, filed Mar. 16, 1992 abandoned.

BACKGROUND OF THE INVENTION

1. Field of the Invention

The present invention generally relates to CCD (charge coupled device) solid state image sensing devices and method of forming a CCD solid state image sensing device and, more particularly, is directed to a structure of a photo-sensitive section formed by a PN junction of a semiconductor.

2. Description of the Prior Art

In general, a photo-sensitive section of a CCD solid state image sensing device is formed of a photodiode by a PN junction of a semiconductor.

FIG. 1 shows an example of a photo-sensitive section according to the prior art in which an N-type impurity diffusion region 22 is formed on the surface of a P-type silicon substrate and a photodiode PD is formed by a PN junction J of the silicon substrate 21 and the N-type impurity diffusion region 22.

FIG. 2 shows an example of a photo-sensitive section according to the prior art in which the N-type impurity diffusion region 22 is formed on the surface of a P-type well region 24 formed on an N-type silicon substrate 23 and the photodiode PD is formed by the PN junction J of the P-type well region 24 and the N-type impurity diffusion region 22. The above-mentioned photodiode PD constructs a photo-sensitive section 25 of a CCD solid state image sensing device.

Then, the above N-type impurity diffusion region 22 is formed by the ion implantation technique of phosphor (P) in the prior art.

However, in the conventional CDD solid state image sensing device, since the N-type diffusion region 22 constructing the photo-sensitive section 25 is formed by the ion implantation technique of phosphor (P), there is then the disadvantage such that a lattice distortion and stress tends to occur on the PN junction plane J formed by the contact of the N-type diffusion region 22 with the P-type silicon substrate 21 or the P-type well region 24.

This is a phenomenon which tends to occur because an atomic radius of the crystal of phosphor (P) is small as compared with that of silicon Si. This phenomenon exerts an influence on an electric characteristic of the CCD solid state image sensing device manufactured. More specifically, due to the lattice distortion and the stress, a leakage current of the reverse direction is increased on the plane of the PN junction J and a dark current is locally increased (i.e., a so-called fluctuation of dark current). There is then the problem such that a white noise, which is one of the defects encountered with an imaging screen, tends to occur.

Further, in the case of phosphor (P), its diffusion coefficient is large so that the phosphor (P) is diffused over a wide region by the activation treatment (heat treatment) after the ion implantation process of phosphor (P). As a consequence, the N-type impurity diffusion region 22 cannot be reduced in size, which brings a disadvantage in making the CCD solid state image sensing device compact in size.

OBJECTS AND SUMMARY OF THE INVENTION

Therefore, it is an object of the present invention to provide an improved CCD solid state image sensing device in which the aforesaid shortcomings and disadvantages of the prior art can be eliminated and a manufacturing method thereof.

More specifically, it is an object of the present invention to provide a CCD solid state image sensing device in which lattice distortion and stress can be alleviated and a manufacturing method thereof.

Another object of the present invention is to provide a CCD solid state image sensing device in which an occurrence of a leakage current can be reduced and a manufacturing method thereof.

Still another object of the present invention is to provide a CCD solid state image sensing device in which a dark current can be reduced and a manufacturing method thereof.

A further object of the present invention is to provide a CCD solid state image sensing device in which a bright flaw, which is one of defects encountered with an image sensing screen, can be reduced and a manufacturing method thereof.

A still further object of the present invention is to provide a CCD solid state image sensing device in which an N-type impurity diffusion region constructing a PN junction can be reduced in size and a manufacturing method thereof.

A yet further object of the present invention is to provide a CCD solid state image sensing device in which the solid state image sensor itself can be made compact in size and a manufacturing method thereof.

As a first aspect of the present invention, the present invention is directed to a CCD solid state image sensing device in which a photo-sensitive section formed of an N-type impurity diffusion region is formed within a P-type substrate or within a P-type impurity diffusion region in correspondence with a pixel. In this case, the CCD solid state image sensing device is characterized in that the N-type impurity diffusion region is formed by impurity diffusion of single substance of arsenic.

In accordance with a second aspect of the present invention, a method of manufacturing a CCD solid state image sensing device is comprised of the steps of forming a first insulating layer made of $SiO_2$ on a P-type substrate or on a P-type impurity diffusion region, forming a second insulating layer made of $Si_3N_4$ on the first insulating layer, forming a third insulating layer made of $SiO_2$ on the second insulating layer, removing the second and third insulating layers formed on the photo-sensitive section, forming a transfer electrode on the third insulating layer, implanting arsenic into the P-type substrate or into the P-type impurity diffusion region in correspondence with pixels by using the transfer electrode as a mask, and carrying out a heat treatment in a nitrogen atmosphere to form the N-type impurity diffusion region.

According to the structure of this invention, since the N-type impurity diffusion region constructing the PN junction of the photo-sensitive section is formed by the impurity diffusion process of only arsenic (As) whose atomic radius is larger than that of phosphor (P) and which is substantially the same as that of silicon (Si) from a crystal standpoint, that is, the N-type impurity diffusion region is formed by the activation process after the arsenic (As) is injected onto the surface of the first P-type well region by the ion implantation technique, the lattice distortion and stress on the PN junction plane are alleviated, the occurrence of the leakage current of the reverse direction on the PN junction plane is reduced and the dark current is reduced, which leads to the reduction of bright flaw which is one of the defects encountered with the image sensing screen. Further, the N-type impurity diffusion region constructing the PN junction can be reduced in size and also the CCD solid state image sensing device itself can be made compact in size.

The above and other objects, features, and advantages of the present invention will become apparent from the following detailed description of an illustrative embodiment thereof when read in conjunction with the accompanying drawings, in which like reference numerals are used to identify the same or similar parts in the several views.

DETAILED DESCRIPTION OF THE PREFERRED EMBODIMENT

The present invention will hereinafter be described with reference to FIG. 3 to FIGS. 5A and 5B.

Figure 1:
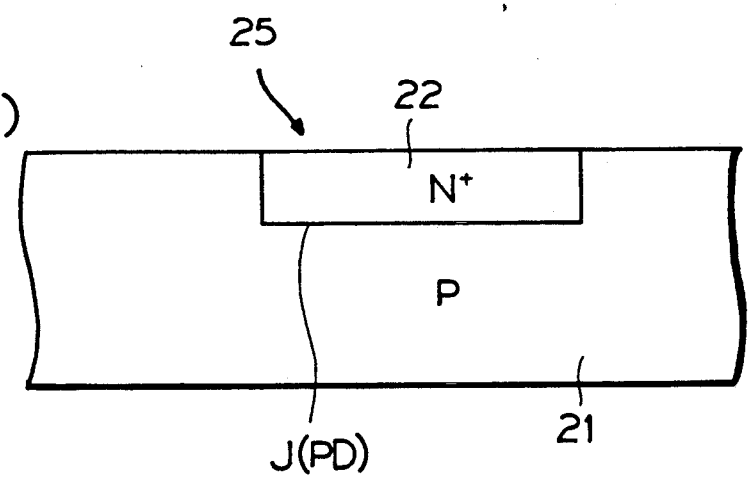
FIG. 1 is a schematic diagram showing a structure of a photo-sensitive section of an example of a CCD solid state image sensing device according to the prior art.
Figure 2:
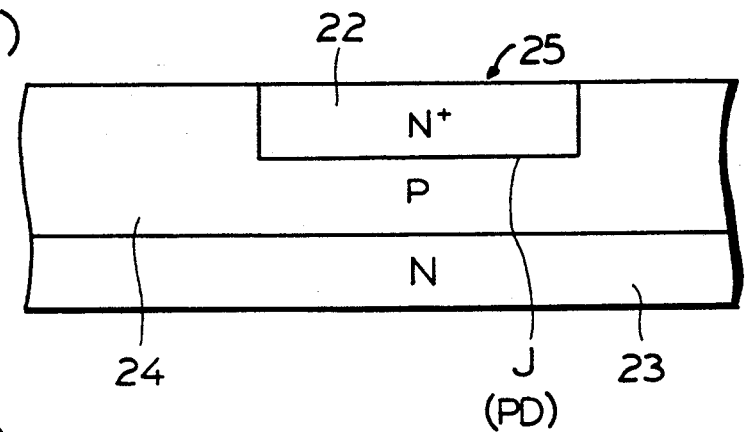
FIG. 2 is a schematic diagram showing a structure of a photo-sensitive section of another example of a CCD solid state image sensing device according to the prior art.
Figure 3:
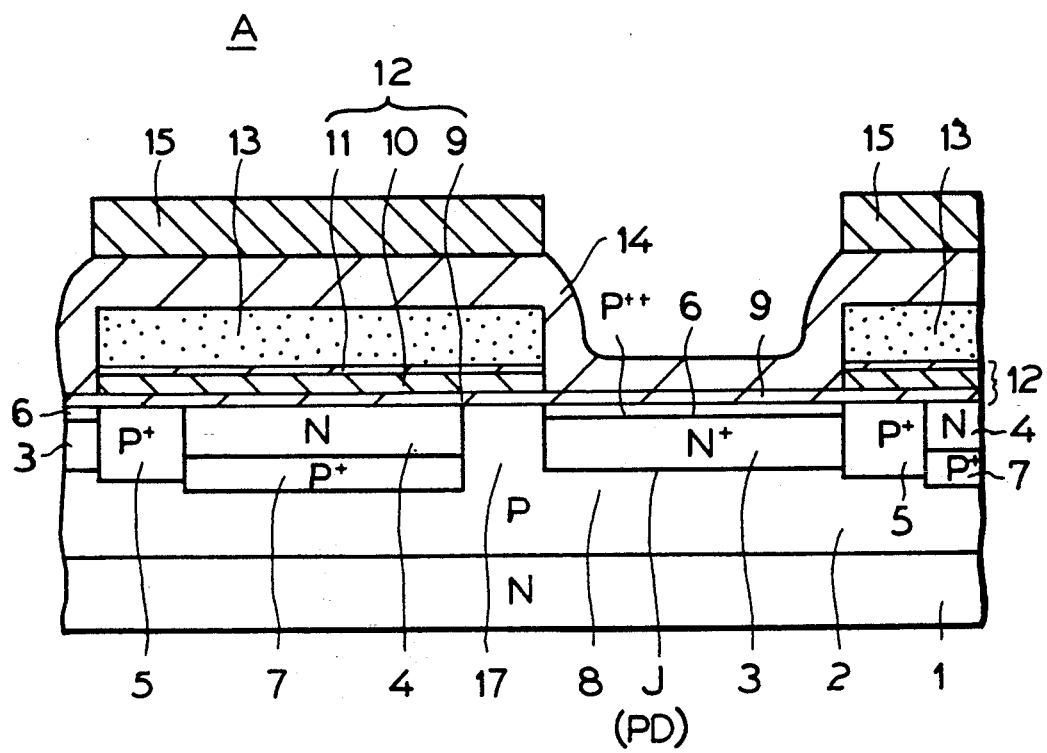
FIG. 3 is a schematic diagram showing a structure of a main portion of a CCD solid state image sensing device according to an embodiment of the present invention.

FIG. 3 is a schematic diagram showing a structure of a main portion of a CCD solid state image sensing device A according to an embodiment of the present invention.

In the CCD solid state image sensing device A, as shown in FIG. 3, an N-type impurity diffusion region 3, a vertical register 4 and a P-type channel stopper region 5 are formed within a first P-type well region 2 formed on an N-type silicon substrate 1, respectively. A P-type positive charge storage region 6 is formed on the N-type impurity diffusion region 3 and a second P-type well region 7 are formed beneath the vertical register 4, respectively. A photo-sensitive section (photoelectric converting section) 8 is formed of a photodiode PD which is formed by a PN junction J between the N-type impurity diffusion region 3 and the first P-type well region 2. This photo-sensitive section 8 is formed in correspondence with a pixel.

An oxide layer 9 made of $SiO_2$ is formed over the whole surface involving the channel stopper region 5, the vertical register 4 and the positive charge storage region 6 of the first P-type well region 2. Further, an $Si_3N_4$ layer 10 and $SiO_2$ layer 11 are sequentially laminated on the vertical register 4 and the channel stopper region 5 through the oxide layer 9. The oxide layer 9, the $Si_3N_4$ layer 10 and the $SiO_2$ layer 11 formed on the vertical register 4 and the channel stopper region 5 constitute a gate insulating layer 12 of a trilayer structure.

A transfer electrode 13 made of a polycrystalline silicon layer is formed on the above-mentioned gate insulating layer 12 on the first P-type well region 2, and an interlayer 14 made of PSG (phosphor-silicate-glass) or the like is laminated on the transfer electrode 13 and the oxide layer 9 on the positive charge storage region 6. Further, an Al light shielding layer 15 is selectively formed on the transfer electrode 13 through the interlayer 14. A read-out gate 17 is constructed between the photo-sensitive section 8 and the vertical register 4.

According to this embodiment, the N-type impurity diffusion region 3 is formed by the ion implantation of arsenic (As). In the process for forming the N-type impurity diffusion region 3, atomic radiuses of phosphor (P) used in the prior art, of arsenic (As) used in this embodiment and of silicon (Si) constructing the substrate 1 are 1.10 Å, 1.18 Å and 1.17 Å from a crystal standpoint, respectively. As it is clear from the above-mentioned atomic radiuses, the atomic radiuses of arsenic (As) and silicon (Si) are very close to each other. Accordingly, when the N-type impurity region 3 is formed by the ion implantation of arsenic (As) according to this embodiment, the lattice distortion and the stress on the PN junction plane J can be alleviated unlike the case where phosphor (P) is employed.

A method of manufacturing the CCD solid state image sensing device according to the embodiment of the present invention will be described next with reference to process diagrams forming FIGS. 4A through 4C and FIGS. 5A, 5B. Throughout FIGS. 4A to 4C and FIGS. 5A, 5B, like parts corresponding to those of FIG. 3 are marked with the same references and therefore need not be described in detail.

Figure 4A:
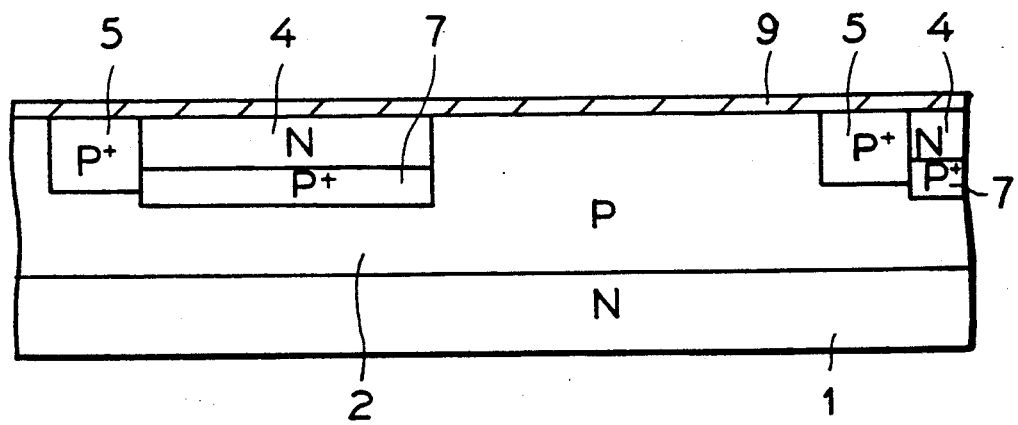
FIGS. 4A through 4C are respectively process diagrams showing a method of manufacturing the CCD solid state image sensing device according to the embodiment of the present invention.

As shown in FIG. 4A, after the oxide layer 9 made of $SiO_2$ is formed on the first P-type well region 2 formed on the N-type silicon substrate 1, N- and P-type impurities are selectively ion-injected into the first P-type well region 2, thereby the N-type vertical register 4, the P-type channel stopper region 5 and the second P-type well region 7 being formed, respectively.

Figure 4B:
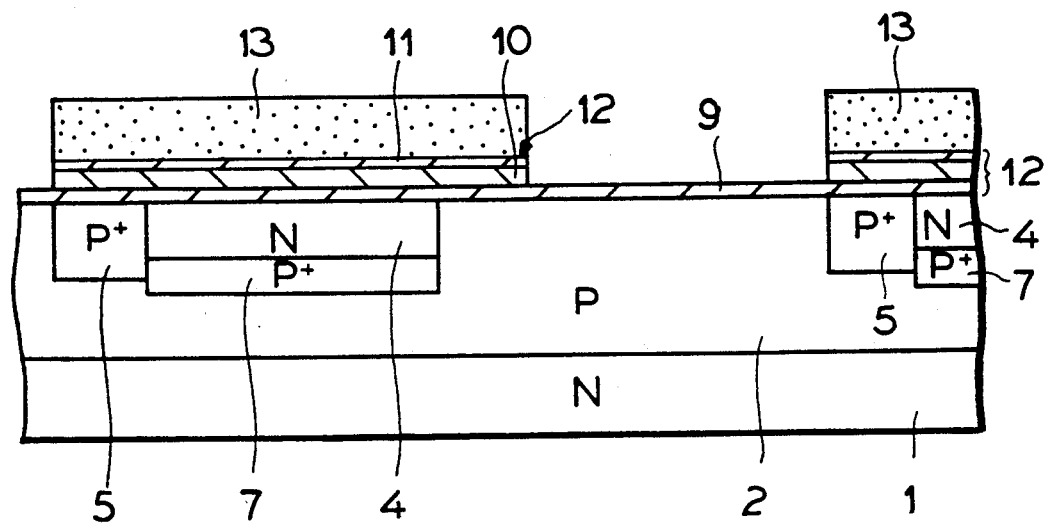

Then, as shown in FIG. 4B, after the $Si_3N_4$ layer 10 and the $SiO_2$ layer 11 are sequentially laminated on the entire surface of the oxide layer 9 formed on the first P-type well region 2, the $Si_3N_4$ layer 10 and the $SiO_2$ layer 11 are selectively etched away at the portions, which will form the photo-sensitive section 8 later, by the etching process. The oxide layer 9, the $Si_3N_4$ layer 10 and the $SiO_2$ layer 11 on the vertical register 4 and the channel stopper region 5 constitute the gate insulating layer 12. Thereafter, the transfer electrode 13 made of the polycrystalline silicon layer is formed on the gate insulating layer 12.

Figure 4C:
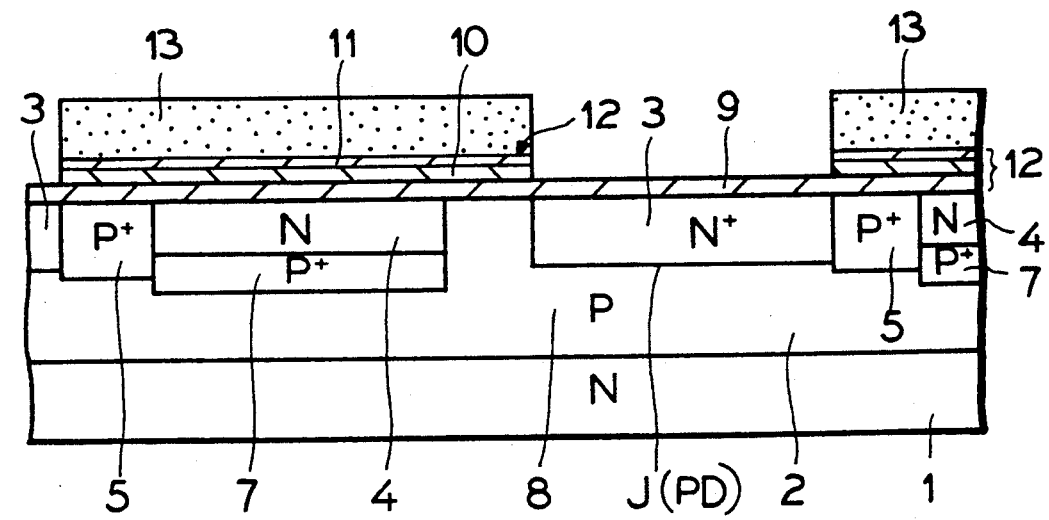

As shown in FIG. 4C, after N-type impurity, e.g., arsenic (As) in this embodiment is selectively injected into the first P-type well region 2, particularly at a relatively deep position such as depth of 0.3 μm to 0.4 μm from the surface of the substrate 1, namely, the first P-type well region 2 by the ion implantation technique by using the transfer electrode 13 as a mask, the heat treatment is carried out in the atmosphere of nitrogen to thereby form the N-type impurity diffusion region 3. At that time, the photodiode PD formed by the PN junction J between the N-type impurity diffusion region 3 and the first P-type well region 2 constructs the photo-sensitive section 8. The above-mentioned heat treatment is carried out by a short time annealing treatment in which a temperature is 1000° C. or more and a heating time lies in a range of from 10 seconds to several 10 s of seconds. Particularly, in this embodiment, the above heat treatment is carried out by a short time annealing technique (i.e., lamp anneal) in which a temperature is 1050° C. and a time is 10 seconds.

Figure 5A:
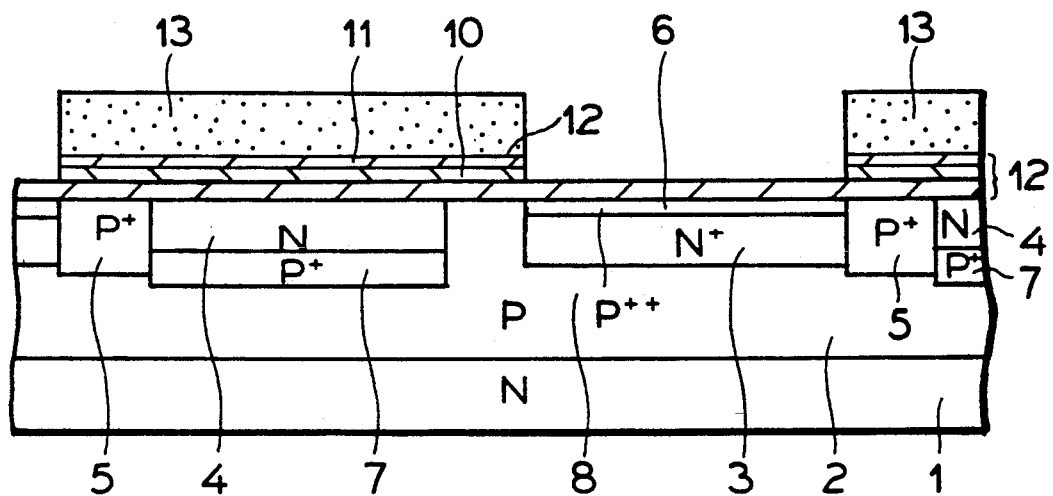
FIGS. 5A and 5B are respectively process diagrams showing a method of manufacturing the CCD solid state image sensing device according to the embodiment of the present invention.

Then, as shown in FIG. 5A, the transfer electrode 13 is employed as a mask and P-type impurity, e.g., boron (B) is selectively injected onto the surface of the photo-sensitive section 8 by the ion implantation technique. Then, the product is heat-treated in the atmosphere of nitrogen and the P-type impurity thus injected is diffused and activated, thereby the P-type positive charge storage region 6 being formed on the surface of the photo-sensitive section 8.

Figure 5B:
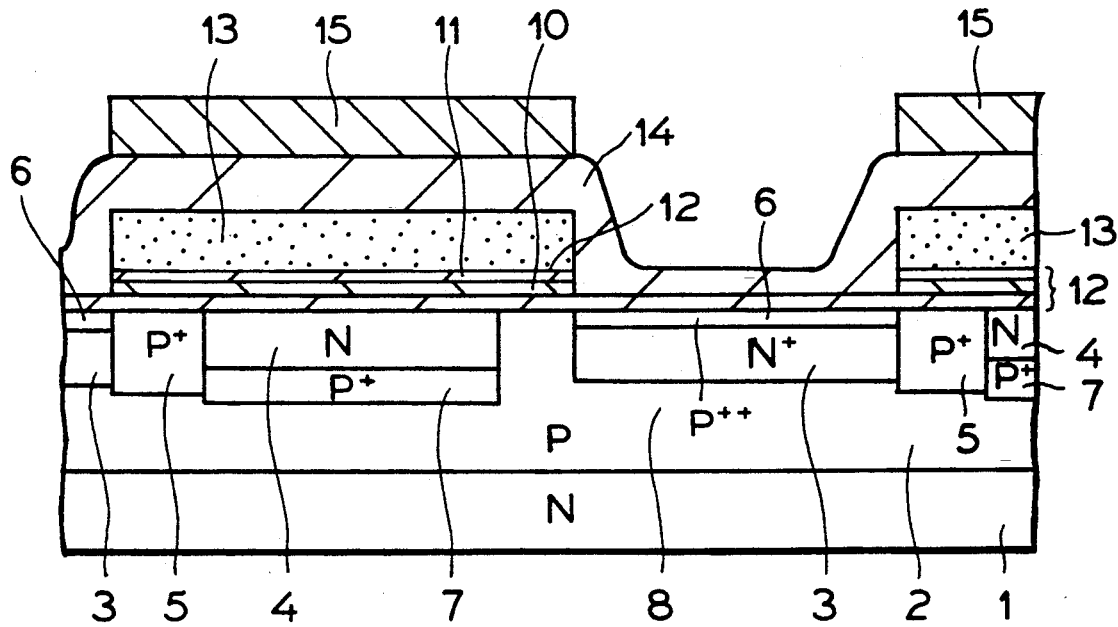

Then, as shown in FIG. 5B, after the interlayer 14 made of PSG or the like is formed on the entire surface involving the transfer electrode 13, the Al light shielding layer 15 is selectively formed on the transfer electrode 13 through the interlayer 14, thereby the CCD solid state image sensing device A according to this embodiment being obtained.

As described above, according to this embodiment, since the N-type impurity diffusion region 3 constructing the PN junction J of the photo-sensitive section 8 is formed by the impurity diffusion process of only arsenic (As) whose atomic radius is larger than that of phosphor (P) and which is substantially the same as that of silicon (Si) from a crystal standpoint, that is, the N-type impurity diffusion region 3 is formed by the activation process after the arsenic (As) is injected onto the surface of the first P-type well region 2 by the ion implantation technique, the lattice distortion and stress on the PN junction plane J are alleviated, the occurrence of the leakage current in the reverse direction on the PN junction plane J is reduced and hence the dark current is reduced, which leads to the reduction of bright flaw on the image sensing screen which is one of the defects encountered with the image sensing screen.

Further, since the arsenic (As) is low in diffusion coefficient, the As impurity can be suppressed from being diffused over a wide area in the succeeding heat treatment, whereby the N-type impurity diffusion region 3 constructing the PN junction J is reduced. In addition, the CCD solid state image sensing device A itself can be made compact in size.

Particularly, in this embodiment, since the arsenic (As) is injected by the ion implantation technique and then the N-type impurity diffusion region 3 is formed by the short time annealing process in the nitrogen atmosphere in which the temperature is 1000° C. or more and the time is in a range of from 10 to several 10 s cf seconds, the local residual defects by the ion implantation of arsenic (As) can be reduced efficiently. As a consequence, the increase of the local dark current due to the residual defects can be prevented and therefore the bright flaw on the image sensing screen can be reduced effectively. Further, since the annealing process is carried out in a short period of time and also the diffusion coefficient of arsenic (As) is small, the N-type impurity diffusion region 3 can be reduced efficiently and the CCD solid state image sensing device A itself can be made compact in size efficiently.

While the N-type impurity diffusion region 3 constructing the photo-sensitive section 8 is formed on the first P-type well region 2 formed on the N-type silicon substrate 1 as described above, the present invention is not limited thereto and a P-type silicon substrate may be used, in which the N-type impurity diffusion region 3 may be directly formed on the P-type silicon substrate. Furthermore, in the above-mentioned embodiment, the P-type hole storage region 6 formed on the surface of the photo-sensitive section 8 may be omitted.

According to the CCD solid state image sensing device of the present invention, the bright flaw on the image sensing screen, which is one of the defects encountered with the image sensing screen, can be reduced. Also, the N-type impurity diffusion region constructing the PN junction can be reduced in size and also the CCD solid state image sensing device itself can be made compact in size.

Having described the preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claims.

What is claimed is:

1. A method of manufacturing a CCD solid state image sensing device comprising the steps of:
    (a) forming a first insulating layer made of $SiO_2$ on a P-type layer;
    (b) forming a second insulating layer made of $Si_3N_4$ on said first insulating layer;
    (c) forming a third insulating layer made of $SiO_2$ on said second insulating layer;
    (d) removing said second and third insulating layers formed on a photo-sensitive section;
    (e) forming a transfer electrode on said third insulating layer;
    (f) implanting arsenic into said P-type layer to form a photo-sensitive region using said transfer electrode as a mask; and
    (g) carrying out a heat treatment in a nitrogen atmosphere to form said N-type impurity diffusion region.

2. The method according to claim 1, in which said arsenic is implanted at a depth between 0.3 $\mu$m to 0.4 $\mu$m.

* * * * *